[US009971682B2](#)

United States Patent
Li et al.

(10) Patent No.: US 9,971,682 B2
(45) Date of Patent: May 15, 2018

(54) WEAR-LEVELING SYSTEM AND METHOD FOR REDUCING STRESS ON MEMORY DEVICE USING ERASE COUNTERS

(71) Applicant: NXP USA, INC., Austin, TX (US)

(72) Inventors: Yaoqiao Li, Suzhou (CN); Xinjie Chen, Suzhou (CN); Xiaoxiang Geng, Suzhou (CN); Jian Zhou, Suzhou (CN)

(73) Assignee: NXP USA, INC., Austin, TX (US)

( * ) Notice: Subject to any disclaimer, the term of this patent is extended or adjusted under 35 U.S.C. 154(b) by 61 days.

(21) Appl. No.: 15/356,667

(22) Filed: Nov. 21, 2016

(65) Prior Publication Data
US 2017/0300408 A1 Oct. 19, 2017

(30) Foreign Application Priority Data

Apr. 15, 2016 (CN) .......................... 2016 1 0232779

(51) Int. Cl.
| | | |
|---|---|---|
| G06F 12/02 | (2006.01) | |
| G06F 13/16 | (2006.01) | |
| G11C 16/10 | (2006.01) | |
| G11C 16/16 | (2006.01) | |
| G11C 16/28 | (2006.01) | |
| G11C 16/34 | (2006.01) | |
| G06F 3/06 | (2006.01) | |

(52) U.S. Cl.
CPC ...... *G06F 12/0246* (2013.01); *G06F 13/1678* (2013.01); *G06F 13/1694* (2013.01); *G11C 16/10* (2013.01); *G11C 16/16* (2013.01); *G11C 16/28* (2013.01); *G11C 16/3495* (2013.01); *G06F 3/0619* (2013.01)

(58) Field of Classification Search
CPC ............. G06F 12/0246; G06F 13/1694; G06F 13/1678; G06F 3/0619; G11C 16/16; G11C 16/28; G11C 16/3495; G11C 16/10
See application file for complete search history.

(56) References Cited

U.S. PATENT DOCUMENTS

| | | | | |
|---|---|---|---|---|
| 7,096,313 | B1 * | 8/2006 | Chang ................. | G06F 12/0246 711/103 |
| 8,331,161 | B2 | 12/2012 | Noh | |
| 8,612,804 | B1 * | 12/2013 | Kang .................. | G11C 16/349 714/42 |
| 8,644,084 | B2 | 2/2014 | Park | |
| 2005/0210214 | A1 * | 9/2005 | Takase .................. | G06F 3/0619 711/165 |
| 2007/0079054 | A1 | 4/2007 | Rudelic | |
| 2008/0313505 | A1 * | 12/2008 | Lee ...................... | G06F 12/0246 714/47.2 |
| 2009/0287875 | A1 * | 11/2009 | Lin ...................... | G06F 12/0246 711/103 |
| 2011/0191521 | A1 * | 8/2011 | Araki .................. | G06F 12/0246 711/103 |

* cited by examiner

*Primary Examiner* — Ajay Ojha
(74) *Attorney, Agent, or Firm* — Charles E. Bergere (57) ABSTRACT

A system for reducing stress on a memory device that has multiple memory blocks. The system includes a counting unit for incrementing count values respectively associated with the memory blocks. Each of the count values indicates the number of times the associated memory block has been erased. A controller monitors the count values. Upon detecting that a count value associated with a first memory block reaches a predefined threshold, the controller selects a second memory block from the memory blocks to be swapped with the first memory block based on a count value associated with the second memory block.

19 Claims, 8 Drawing Sheets

WEAR-LEVELING SYSTEM AND METHOD FOR REDUCING STRESS ON MEMORY DEVICE USING ERASE COUNTERS

BACKGROUND

The present invention relates to memory devices and, more particularly, to a system and a method for reducing stress on memory devices.

Figure 1:
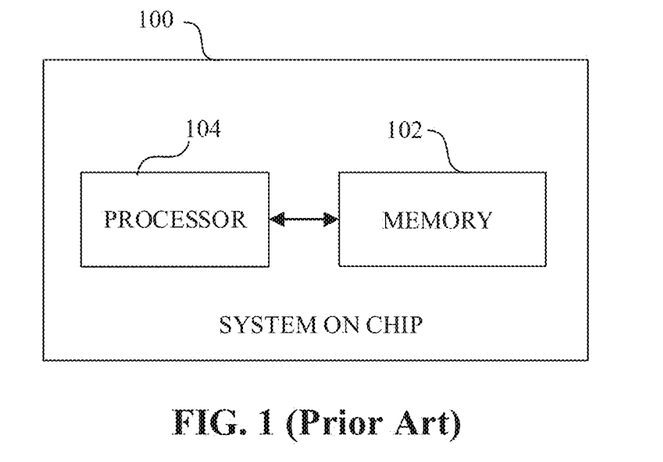
FIG. 1 shows a block diagram of a conventional system.

FIG. 1 shows a conventional system 100 including a memory 102 for storing code and data, and a processor 104 connected to the memory 102 for executing the code stored in the memory 102, and reading data from or writing data to the memory 102. For example, the system 100 can be a system-on-chip (SoC) that is an integrated circuit integrating the processor, memory and other components onto a single chip.

Figure 2:
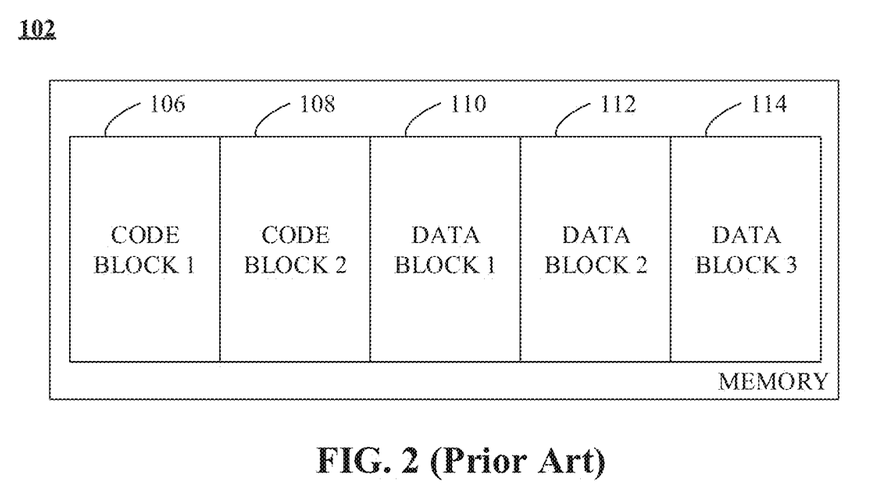
FIG. 2 shows a conventional structure of a memory device in the system of FIG. 1.

FIG. 2 shows a conventional structure of the memory 102 in the system of FIG. 1. The memory 102 can be a non-volatile memory (NVM), which is widely used to store the code and data. Typically, the NVM is logically divided into many logical memory blocks of equal size, with some of the memory blocks being configured to store the code and some the data. For example, as shown in FIG. 2, the NVM 102 with a size of 1280 kB is divided into first through fifth memory blocks 106-114, each having a size of 256 kB. The first and second memory blocks 106 and 108 store the code, namely code blocks, and the third through fifth blocks 110-114 store the data, namely data blocks. The code in the code blocks 106 and 108 is usually programmed during manufacturing, and seldom reprogrammed by customers. The data blocks 110-114 are read from and written to frequently during operation of the system 100. Writing data to the data blocks includes erasing data previously stored in the data blocks and storing new data in the data blocks. Therefore, the data blocks 110-114 suffer more erasing stress than the code blocks 106-108, and reach erase cycles earlier than the code blocks 106-108. The life length of the system 100 partially depends on the life length of the memory 102, and the life length of the memory 102 is limited by the first memory block of the NVM that reaches the maximum number of erase cycles. It is therefore desirable to find a method for reducing the erase stress on the memory device to extend the life of the SoC.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a system for reducing stress on a memory device, wherein the memory device includes a plurality of memory blocks. The system includes a reading and writing unit for reading from and writing to the memory device based on a given address, wherein said writing includes erasing data stored in the memory device, a counting unit connected to the reading and writing unit for incrementing a plurality of count values, wherein each of the memory blocks is associated with at least one of the count values that indicates a number of times the memory block associated therewith is erased, and a controller connected to the counting unit for monitoring the count values, wherein upon detecting that a count value associated with a first memory block of the plurality of memory blocks reaches a predetermined threshold, the controller selects a second memory block from the plurality of memory blocks to be swapped with the first memory block based on a count value associated with the second memory block, swaps data stored in the first and second memory blocks, and generates corresponding swapping information.

In another embodiment, the present invention provides a method of reducing stress on a memory device, wherein the memory device includes a plurality of memory blocks. The method includes incrementing a count value associated with a memory block each time said memory block is erased, detecting if a count value of a first memory block of the plurality of memory blocks has reached a predetermined threshold, upon detecting that the count value has reached the predetermined threshold, selecting a second memory block from the plurality of memory blocks and swapping data stored in the first memory block with data stored in the second memory block, wherein a count value of the second memory block is less than the count value of the first memory block, and generating corresponding swapping information.

Figure 3:
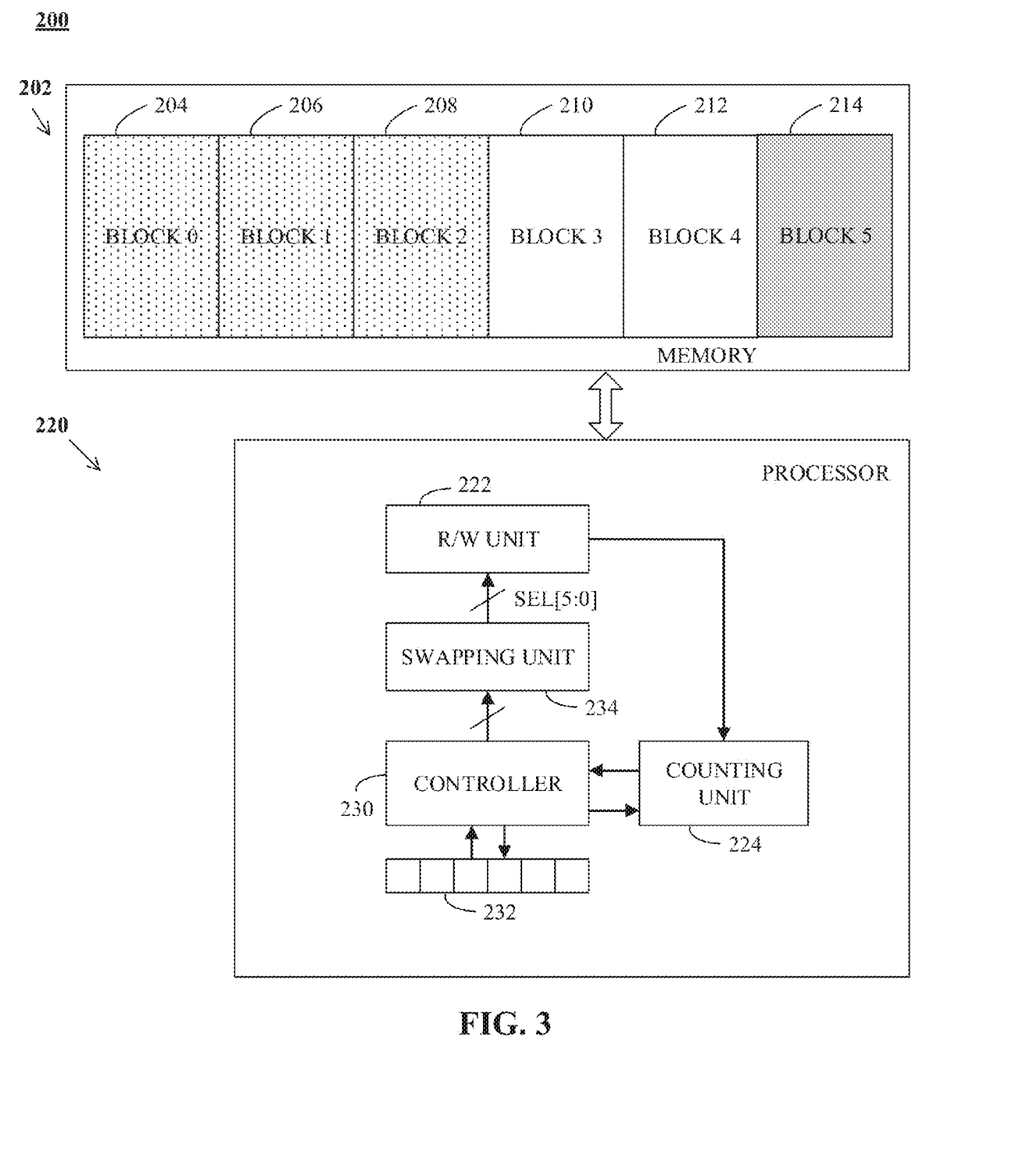
FIG. 3 is a block diagram of a system for reducing stress of a memory device in accordance with an embodiment of the invention.

Referring now to FIG. 3, a block diagram of a system 200 for reducing stress of a memory device in accordance with an embodiment of the invention is shown. The system 200 includes a memory 202 that is divided into a plurality of memory blocks 204-214, wherein data stored in the memory 202 includes code and data of the system 200, and a processor 220 connected to the memory 202 for executing the code of the system 200, and reading data from or writing data to the memory 202. In a preferred embodiment, the plurality of memory blocks 204-214 include at least a first memory block 204 that stores the data of the system 200, and at least a second memory block 208 that stores the code of the system 200. In a preferred embodiment, the memory 202 is a non-volatile memory (NVM), a flash memory, or an electrically erasable programmable read-only memory (EEPROM). The processor 220 preferably comprises a processor of an MCU of the system 200, or alternatively could comprise a separate processor within the system 200.

The processor 220 includes a reading and writing unit 222 for reading from and writing to the memory 200, wherein said writing includes erasing data previously stored in the memory 200, and a counting unit 224 connected to the reading and writing unit 222 for updating a plurality of count values, wherein each of the memory blocks 204-214 is associated with at least one of the count values that indicates a number of times the memory block associated therewith has been erased.

Figure 4:
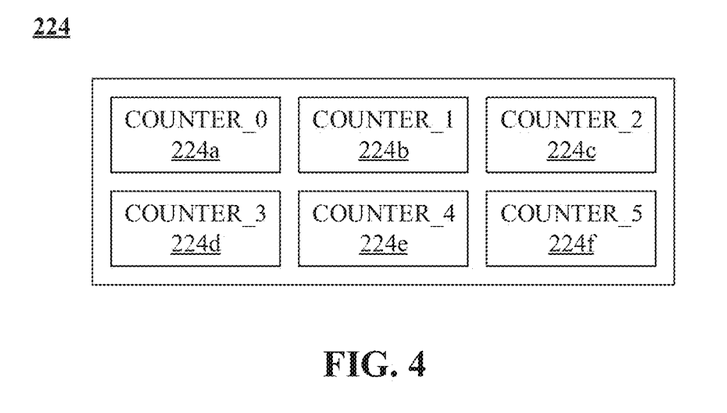
FIG. 4 is a block diagram of a counting unit of the system of FIG. 3 in accordance with an embodiment of the invention.
Figure 5:
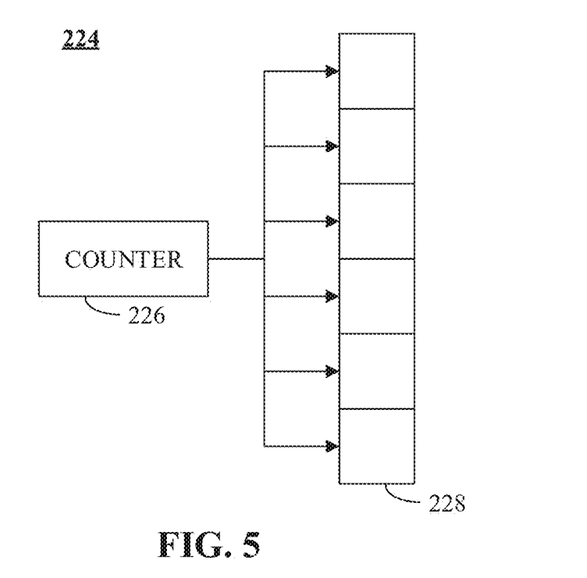
FIG. 5 is a block diagram of a counting unit of the system of FIG. 3 in accordance with another embodiment of the invention.

FIG. 4 shows a block diagram of the counting unit 224 of the system of FIG. 3 in accordance with an embodiment of the invention. In a preferred embodiment, the counting unit 224 includes a plurality of counters 224a-224f each is associated with one of the memory blocks 204-214. FIG. 5 shows a block diagram of the counting unit 224 of the system of FIG. 3 in accordance with another embodiment of the invention. In a preferred embodiment, the counting unit 224 includes a counter 226 and a plurality of first registers 228, wherein each of the plurality of first registers 228 stores the count value of the memory block associated therewith, wherein the counter 226 updates the count values stored in the plurality of first registers 228.

Referring back to FIG. 3, the processor 220 further includes a controller 230 connected to the counting unit 224 for monitoring the count values. In a preferred embodiment, upon detecting that a count value associated with the first memory block 204 has reached a predetermined threshold, the controller 230 selects the second memory block 210 from the plurality of memory blocks 204-214 to be swapped with the first memory block 204 based on a count value of the second memory block 210 that is lower than the count value of the first memory block 204. The controller 230 swaps data stored in the first and second memory blocks 204 and 210, and generates corresponding swapping information. In a preferred embodiment, the predetermined threshold is set based on erase cycles of the memory 202. In a preferred embodiment, the second memory block 210 is the memory block having a lowest count value amongst the plurality of memory blocks 204-214.

In a preferred embodiment, the controller 230 swaps data stored in the first and second memory blocks 204 and 210 by copying the code of the system 200 stored in the second memory block 210 to the first memory block 204 and erasing the code of the system stored in the second memory block 210 if all the data stored in the first memory block 204 has been erased.

In another preferred embodiment, the memory 202 further includes a dummy memory block 214, wherein the controller 230 swaps data stored in the first and second memory blocks 204 and 210 via the dummy memory block 214 if only part of the data stored in the first memory block 204 has been erased. In a preferred embodiment, upon detecting that the count value of the second memory block 210 also reaches the predetermined threshold after selecting the second memory block 210, the controller 230 selects the dummy memory block 214 to be swapped with the first memory block 204 and generates the corresponding swapping information.

In a preferred embodiment, the processor 220 also includes a second register 232 connected to the controller 230 that stores a plurality of flags respectively associated with the memory blocks 204-214. The controller 230 sets a flag associated with the first memory block 204 to a first value if the count value associated with the first memory block 204 has reached the predetermined threshold and the first memory block 204 has been swapped with the second memory block 210, and the controller 230 stops monitoring the count value associated with the first memory block 204 if the flag associated with the first memory block 204 is set to the first value. In a preferred embodiment, the counting unit 224 stops updating the count value associated with the first memory block 204 if the flag associated with the first memory block 204 is set to the first value.

Figure 6:
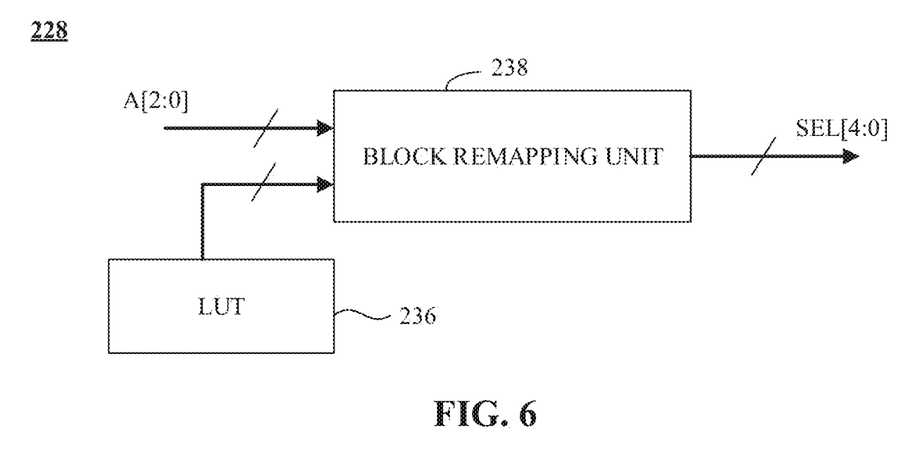
FIG. 6 is a block diagram of a swapping unit of the system of FIG. 3 in accordance with an embodiment of the invention.

The processor 220 further includes a swapping unit 234 connected between the reading and writing unit 222 and the controller 230 for remapping the first and second memory blocks with each other. FIG. 6 is a block diagram of the swapping unit 234 of the system of FIG. 3 in accordance with an embodiment of the invention. The swapping unit 234 includes a look-up table 236 that stores the swapping information provided by the controller 230, and a block remapping unit 238 that selects a memory block from the plurality of memory blocks 204-214 based on the look-up table 236 and the given address, such that the reading and writing unit 222 reads data from or writes data to the selected memory block. In a preferred embodiment, the swapping information comprises a mapping between the first memory block 204 and an address of the second memory block 210, and vice versa.

In a preferred embodiment, the counter values, the plurality of flags and the look-up table 236 are also stored in a second memory device (not shown) of the system 200 separate from the memory 202, and are loaded to the processor 220 during initialization of the memory 202 before the processor 220 has been initialized during reset of the system 200.

In a preferred embodiment, the controller 230 holds a request to read the code stored in the second memory block 210 when the code of the system stored in the second memory block 210 is being copied to the first memory block 204, and releases the request after the swapping information has been generated.

In another preferred embodiment, the system 200 further includes a separate central processing unit (CPU) in communication with the processor 220 for executing the code of the system 200, and reading from and writing to the memory 202 via the processor 220, wherein the processor 220 is a memory controlling device dedicated for the memory 202.

Figure 7:
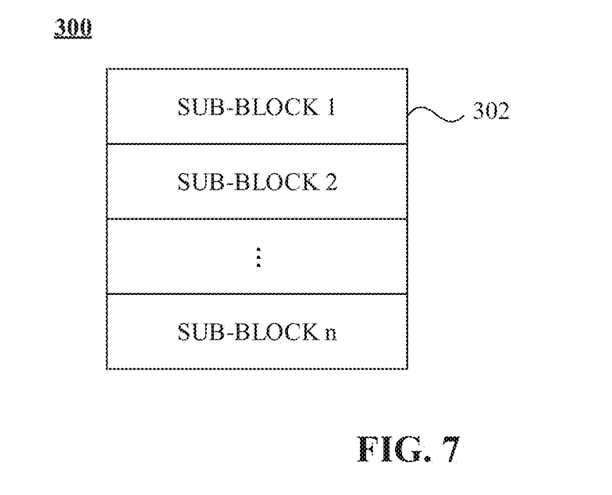
FIG. 7 shows a structure of a memory block of the memory device of FIG. 3 in accordance with an embodiment of the invention.

Referring now to FIG. 7, a structure of a memory block 300 of the memory 202 of FIG. 3 in accordance with an embodiment of the invention is shown. In a preferred embodiment, each of the memory blocks 204-214 is divided into a plurality of sub-blocks 302. For example, a memory block with a size of 256 kB is divided into 32 sub-blocks each having a size of 8 kB, wherein the size of each sub-block is determined as n times of a minimum erasing size of the NVM, wherein n is a natural number. In a preferred embodiment, every time the memory block 300 is erased, the count value of the memory block 300 is updated based on a number of the sub-blocks 302 that are erased. In another preferred embodiment, each of the sub-blocks 302 is associated with one of the plurality of count values that is updated once the sub-block 302 associated therewith has been erased, wherein the second memory block 210 is selected based on the sub-block 302 that has a highest count value amongst the plurality of sub-blocks 302 of the second memory block 300.

Figure 8:
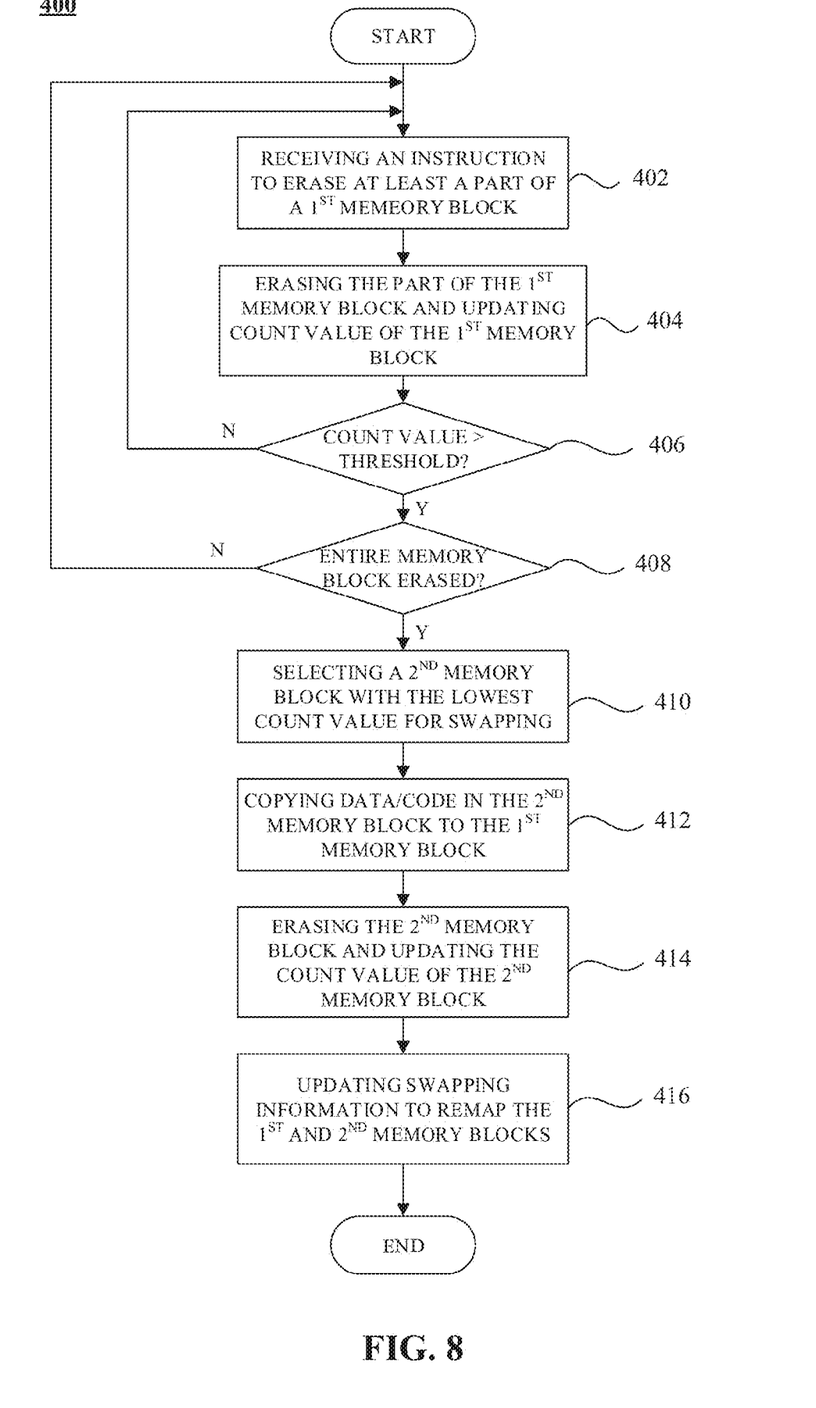
FIG. 8 is a flow chart of a method for reducing stress on a memory device in accordance with a first embodiment of the invention.

FIG. 8 is a flow chart 400 of a method performed by a system 200 for reducing stress on a memory device in accordance with a first embodiment of the invention. The memory 202 as shown in FIG. 3 is divided into a plurality of memory blocks 204-214, wherein data stored in the memory 202 includes code and data of the system 200. The system 200 further includes a processor 220 connected to the memory 202 for executing the code of the system 200, and reading data from or writing data to the memory 202. In a preferred embodiment, the plurality of memory blocks 204-214 include at least a first memory block 204 that stores the data of the system 200, and at least a second memory block 208 that stores the code of the system 200. In a preferred embodiment, the memory 202 is a non-volatile memory (NVM), a flash, or an EEPROM. The processor 220 preferably comprises a processor of an MCU of the system 200, or alternatively could comprise a separate processor within the system 200.

Starting at step 402, the controller 230 receives an erasing instruction to erase at least a part of the data stored in the first memory block 204 based on a given address. In a preferred embodiment, the erasing instruction is included in a writing instruction to write data to the first memory block 204.

At step 404, the reading and writing unit 222 erases the part of data stored in the first memory block 204 and updating a count value associated with the first memory block 204, wherein the count value indicates a number of times the memory block associated therewith has been erased. In a preferred embodiment, as shown in FIG. 7, each of the memory blocks 204-214 is divided into a plurality of sub-blocks 302. For example, a memory block with a size of 256 kB is divided into 32 sub-blocks each having a size of 8 kB, wherein the size of each sub-block is determined as n times of a minimum erasing size of the NVM, wherein n is a natural number. In a preferred embodiment, every time the memory block 300 is erased, the count value associated with the memory block 300 is updated based on a number of the sub-blocks 302 that are erased.

At step 406, the controller 230 detects if the count value associated with the first memory block 204 has reached a predetermined threshold. In a preferred embodiment, the predetermined threshold is set based on erase cycles of the memory 202.

At step 408, if the count value associated with the first memory block 204 has reached a predetermined threshold, the controller 230 further determines if the part of data comprises all the data stored in the first memory block 204.

At step 410, if the part of data comprises all the data stored in the first memory block 204, that is, all the data stored in the first memory block 204 has been erased, the controller 230 selects the second memory block 210 from the plurality of memory blocks 204-214 to be swapped with the first memory block 204 based on a count value of the second memory block 210 that is lower than the count value of the first memory block 204. In a preferred embodiment, the second memory block 210 is the memory block having a lowest count value amongst the plurality of memory blocks 204-214.

At step 412, the controller 230 copies the code of the system 200 stored in the second memory block 210 to the first memory block 204.

At step 414, the controller 230 erases the code of the system 200 stored in the second memory block 210 and updates the count value associated with the second memory block 210.

At step 416, the controller 230 updates swapping information to remapping the first and second memory blocks with each other. In a preferred embodiment, the swapping information comprises a mapping between the first memory block 204 and an address of the second memory block 210, and vice versa.

In the flow chart 400 of FIG. 8, the controller 230 will not selects the second memory block 210 to be swapped with the first memory block 204 until the count value associated with the first memory block 204 has reached the predetermined threshold and the part of the data that has been erased comprise all the data stored in the first memory block 204.

Figure 9:
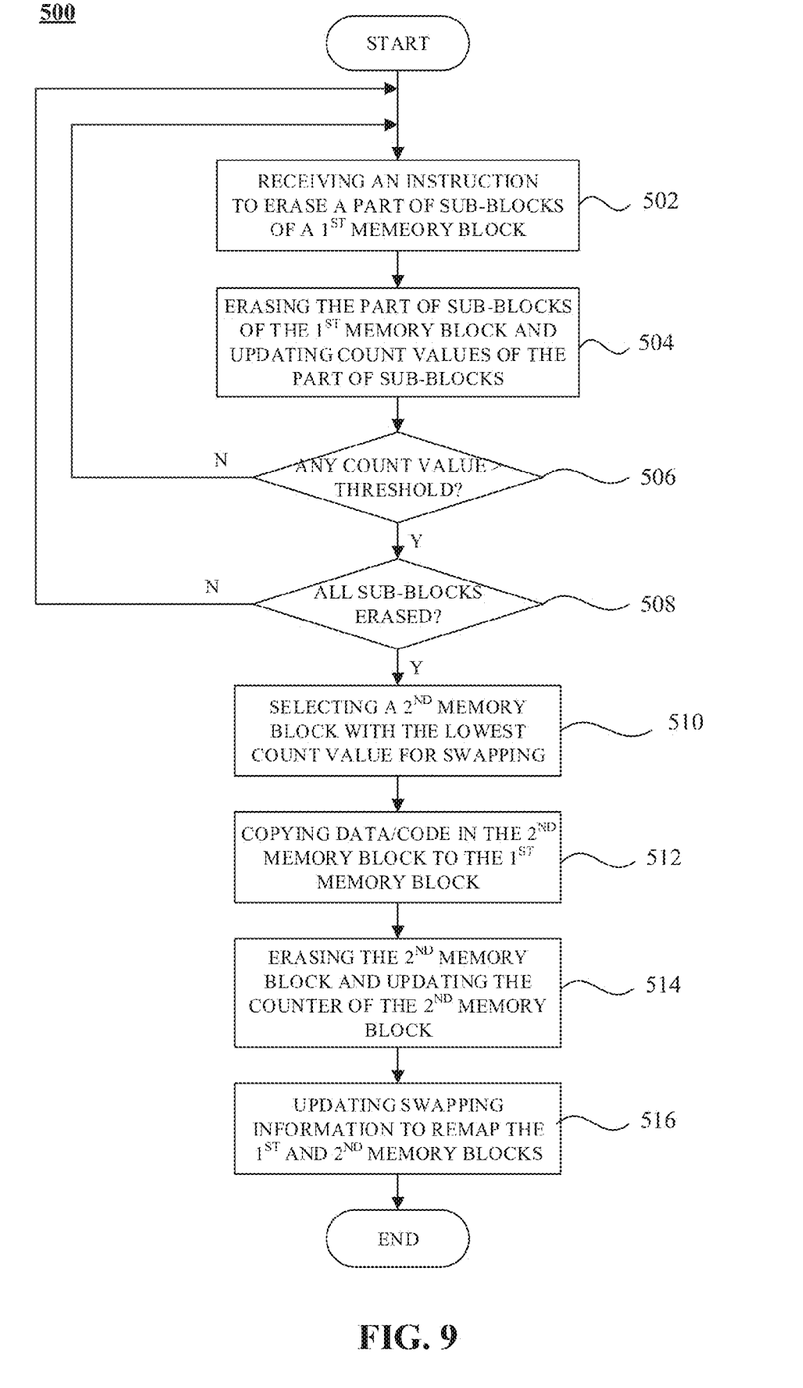
FIG. 9 is a flow chart of a method for reducing stress on a memory device in accordance with a second embodiment of the invention.

FIG. 9 is a flow chart 500 of a method for reducing stress on a memory device in accordance with a second embodiment of the invention. In a preferred embodiment, each of the sub-blocks has a count value associated therewith indicating a number of times that the sub-block has been erased.

The flow chart 500 of FIG. 9 is substantially the same as the flow chart of FIG. 8 except that at step 504, the count value of each of the sub-blocks is updated once the associated sub-block has been erased, and at step 506, the controller 230 detects if any of the count values of the sub-blocks has reached the predetermined threshold.

Figure 10:
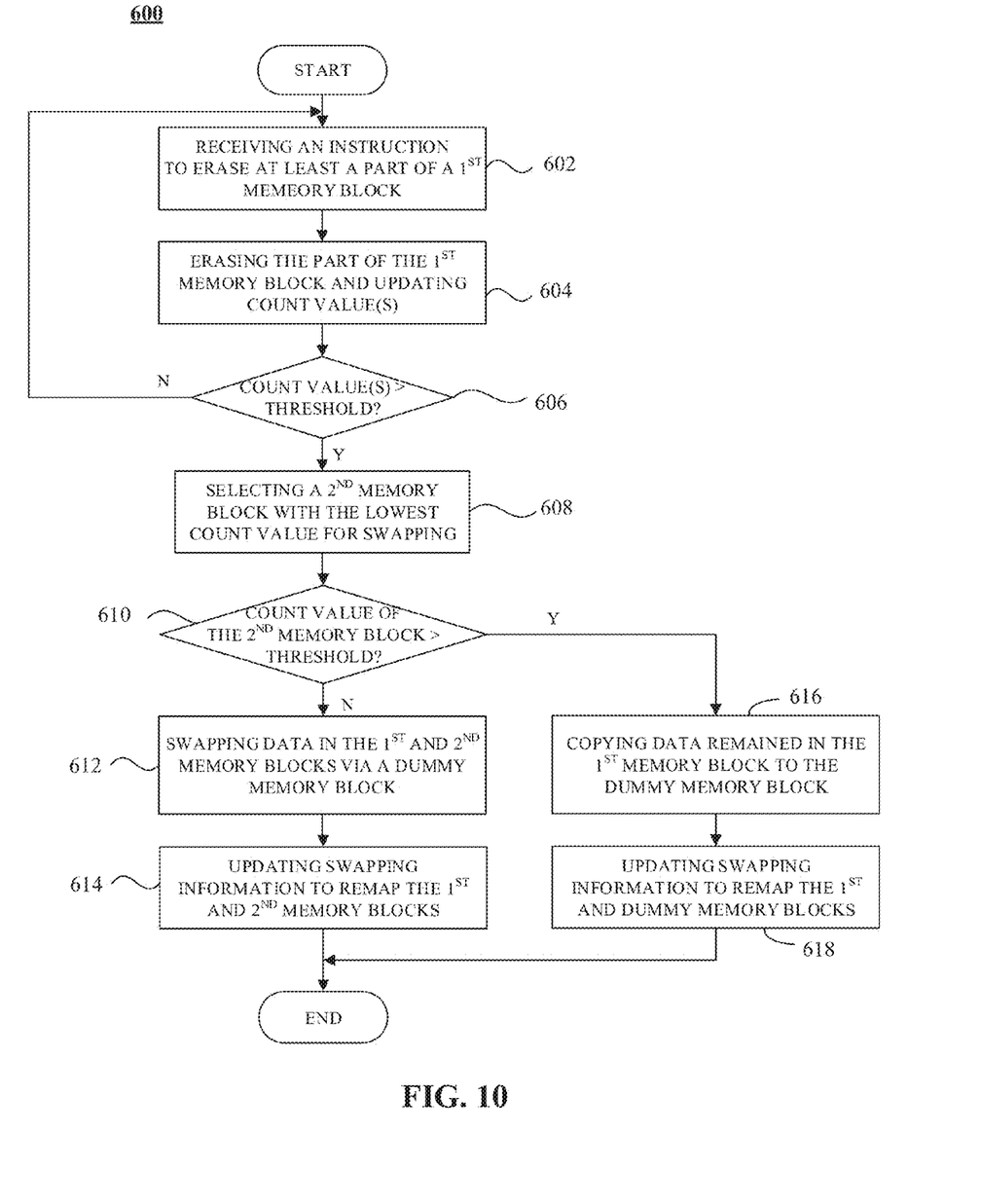
FIG. 10 is a flow chart of a method for reducing stress on a memory device in accordance with a third embodiment of the invention.

FIG. 10 is a flow chart 600 of a method for reducing stress on a memory device in accordance with a third embodiment of the invention. In another preferred embodiment, the memory 202 further includes a dummy memory block 214. The first three steps 602-606 in the flow chart 600 of FIG. 10 can be same as the first three steps 402-406 in the flow chart 400 in the flow chart of FIG. 8 or the first three steps 502-506 in the flow chart 500 of the FIG. 9. At step 608, if the count value associated with the first memory block 204 has been reached the predetermined threshold, the controller 230 selects the second memory block 210 to be swapped with the first memory block 204.

At step 610, the controller 230 further detects if the count value of the second memory block 210 has reached the predetermined threshold. At step 612, if the count value associated with the second memory block 210 has not reached the predetermined threshold, the controller 230 swaps data stored in the first and second memory block 204 and 210 via the dummy block 214, and at step 614, the controller 230 updates swapping information to remap the first and second memory blocks 204 and 210 with each other.

At step 616, if the count value of the second memory block 210 has reached the predetermined threshold, the controller 230 copies the data remained in the first memory block 204 to the dummy memory block 214, and at step 618, the controller 230 updates swapping information to remap the first memory blocks 204 and the dummy memory block 214 with each other.

Figure 11:
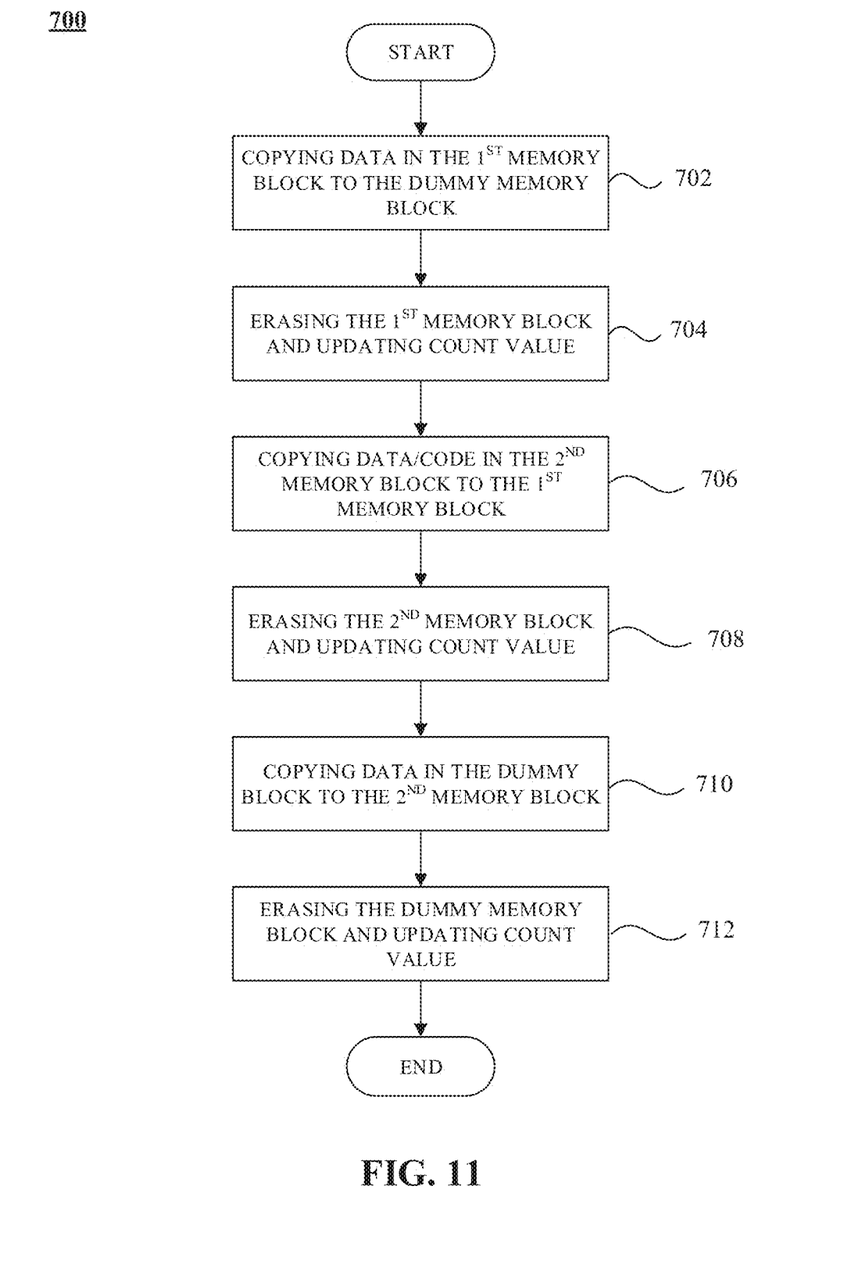
FIG. 11 is a flow chart of a method of swapping memory blocks via a dummy memory block of FIG. 10 in accordance with an embodiment of the invention.

FIG. 11 is a flow chart 700 of the step 612 of swapping memory blocks via a dummy memory block of FIG. 10 in accordance with an embodiment of the invention.

Starting at step 702, the controller 230 copies data remained in the first memory block 204 to the dummy memory block 214. At step 704, the controller 230 erases the first memory block 204 and updates the count value associated with the first memory block 204. At step 706, the controller 230 copies the code of the system stored in the second memory block 210 to the first memory block 204. At step 708, the controller 230 erases the code of the system stored in the second memory block 210 and updates the count value associated with the second memory block 210. At step 710, the controller 230 copies the data in the dummy memory block 214 to the second memory block 210, and at step 712, the controller erases the data in the dummy memory block 214 and updates the count value associated with the dummy memory block 214.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A system for reducing stress on a memory device, wherein the memory device comprises a plurality of memory blocks, the system comprising:
   a reading and writing unit for reading from and writing to the memory device based on a given address, wherein said writing includes erasing data stored in the memory device;
   a counting unit connected to the reading and writing unit for updating a plurality of count values, wherein each of the memory blocks is associated with at least one of the count values that indicates a number of times the memory block associated therewith is erased;
   a controller connected to the counting unit for monitoring the count values, wherein upon detecting that a count value associated with a first memory block of the plurality of memory blocks reaches a predetermined threshold, the controller selects a second memory block from the plurality of memory blocks to be swapped with the first memory block based on a count value associated with the second memory block, swaps data stored in the first and second memory blocks, and generates corresponding swapping information; and
   a flag register that stores a plurality of flags respectively associated with the memory blocks, wherein the controller sets a flag associated with the first memory block to a first value if the count value associated with the first memory block has reached the predetermined threshold and the first memory block has been swapped with the second memory block, and wherein the controller stops monitoring the count value associated with the first memory block if the flag associated with the first memory block is set to the first value.

2. The system of claim 1, wherein the system further comprises a swapping unit for remapping the first and second memory blocks with each other, wherein the swapping unit comprises:
   a look-up table that stores the swapping information provided by the controller, and
   a block remapping unit that selects a memory block from the plurality of memory blocks based on the look-up table and the given address, such that the reading and writing unit exchanges data with the selected memory block.

3. The system of claim 1, wherein each of the memory blocks comprises a plurality of sub-blocks, wherein every time one of the memory blocks is erased the count value of the memory block is updated based on a number of the sub-blocks that are erased.

4. The system of claim 1, wherein each of the memory blocks comprises a plurality of sub-blocks, wherein each of the sub-blocks is associated with one of the plurality of count values that is updated once the sub-block associated therewith has been erased, wherein the second memory block is selected based on a sub-block that has a highest count value amongst the plurality of sub-blocks of the second memory block.

5. The system of claim 1, wherein the controller monitors the count value of the first memory block after said count value has been updated, wherein upon detecting that the count value of the first memory block reaches the predetermined threshold, the controller selects the second memory block for swapping if all data in the first memory block is erased.

6. The system of claim 5, wherein the controller swaps data stored in the first and second memory blocks by copying the data in the second memory block to the first memory block and erasing the data stored in the second memory block.

7. The system of claim 1, wherein the memory device further comprises a dummy memory block, wherein the controller swaps data stored in the first and second memory blocks via the dummy memory block.

8. The system of claim 7, wherein upon detecting that the count value of the second memory block reaches the predetermined threshold after selecting the second memory block, the controller selects the dummy memory block to be swapped with the first memory block and generates the corresponding swapping information.

9. The system of claim 1, wherein the counting unit comprises one counter and a plurality of first registers, wherein each of the plurality of first register stores the count value of the memory block associated therewith.

10. The system of claim 1, wherein the second memory block comprises the memory block having a lowest count value.

11. A method of reducing stress on a memory device, wherein the memory device comprises a plurality of memory blocks, the method comprising:
   incrementing a count value associated with a memory block each time said memory block is erased;
   detecting if a count value of a first memory block of the plurality of memory blocks has reached a predetermined threshold;
   upon detecting that the count value has reached the predetermined threshold, selecting a second memory block from the plurality of memory blocks and swapping data stored in the first memory block with data stored in the second memory block, wherein a count value of the second memory block is less than the count value of the first memory block;

generating corresponding swapping information;

setting a flag associated with the first memory block to a first value if the count value associated with the first memory block has reached the predetermined threshold and the first memory block has been swapped with the second memory block; and stopping monitoring the count value associated with the first memory block when the flag associated with the first memory block is set.

12. The method of claim 11, wherein the second memory block is the memory block having a lowest count value amongst the plurality of memory blocks.

13. The method of claim 11, further comprising:
storing the corresponding swapping information in a look-up table, wherein the swapping information comprises a mapping between the first memory block and the second memory block after said swapping.

14. The method of claim 13, further comprising:
upon receipt of a reading or writing request with a given address, selecting a memory block from the plurality of memory blocks based on the look-up table and the given address; and
reading data from or writing data to the selected memory block.

15. The method of claim 11, further comprising:
partitioning each of the plurality of memory blocks into a plurality of sub-blocks, and
every time one of the memory blocks is erased, updating the count value of the one of the memory block based on the number of sub-blocks that are erased.

16. The method of claim 11, further comprising:
partitioning each of the plurality of blocks into a plurality of sub-blocks, and
associating each of the plurality of sub-blocks with one count value that is updated every time an associated sub-block is erased, wherein the second memory block is selected based on a sub-block that has a highest count value amongst the plurality of sub-blocks.

17. The method of claim 11, further comprising upon detecting that the count value of the first memory block has reached the predetermined threshold after the count value has been updated once the first memory block has been erased, selecting the second memory block for swapping if all data in the first memory block has been erased.

18. The method of claim 17, wherein swapping data stored in the first and second memory blocks comprises copying the data in the second memory block to the first memory block and erasing the data stored in the second memory block.

19. The method of claim 11, wherein the memory device further comprises a dummy memory block, wherein data stored in the first and second memory blocks are swapped via the dummy memory block, the method further comprising:
detecting if the count value associated with the second memory block reaches the predetermined threshold after selecting the second memory block,
selecting the dummy memory block to be swapped with the first memory block if the count value associated with the second memory block reaches the predetermined threshold, and
generating the corresponding swapping information.

* * * * *